US005604680A

United States Patent [19]
Bamji et al.

[11] Patent Number: 5,604,680
[45] Date of Patent: Feb. 18, 1997

[54] VIRTUAL INTERFACE REPRESENTATION OF HIERARCHICAL SYMBOLIC LAYOUTS

[75] Inventors: Cyrus Bamji; Ravi Varadarajan, both of Fremont, Calif.

[73] Assignee: Cadence Design Systems, Inc., San Jose, Calif.

[21] Appl. No.: 290,364

[22] Filed: Aug. 15, 1994

[51] Int. Cl.$^6$ .................................................. G06F 17/50
[52] U.S. Cl. .......................................... 364/491; 364/488
[58] Field of Search .................................. 364/488, 489, 364/490, 491

[56] References Cited

U.S. PATENT DOCUMENTS

| | | | |
|---|---|---|---|
| 4,815,003 | 3/1989 | Putatunda et al. | 364/491 |
| 5,262,959 | 11/1993 | Chkoreff | 364/489 |
| 5,481,473 | 1/1996 | Kim et al. | 364/490 |

OTHER PUBLICATIONS

Gohar et al., "A New Schematic–Driven Floorplanning Algorithm for Analog Cell Layout", IEEE ISCAS, May 1993, pp. 1770–1773.
Jabri, "Automatic Building of Graphs Rectangularly Dualisable for Use in IC Floorplanning," ISCAS '88, pp. 1683–1686.
The et al., "Area Optimization for Higher Order Hierarchical Floorplans", ICCD '91, pp. 520–523.
Bamji et al. "A Design By Example Regular Structure Generator", 1985 *22nd Design Automation Conference*, Paper 2.3, pp. 16–21.
Barker et al. "The Development of a Graphical Environment for the Computer Aided Design of Control Systems," *IEE Conference Publication 285, Control '88* pp. 81–86.
Boyer "Symbolic Layout Compaction Review," *1988 25th ACM/IEEE Design Automation Conference*, Paper 26.1, pp. 383–389.
Costa et al. "Symbolic Generation of Constrained Random Logic Cells," *IEEE Transactions on Computer–Aided Design*, vol. 10, No. 2, Feb. 1991, pp. 220–231.
Costa et al. "Automatic Generation of Symbolic Cells from a Net–list Description," *1989 Proceedings of VLSI and Computer Peripherals*, pp. 35–39.
Dutt et al. "On Minimal Closure Constraint Generation for Symbolic Cell Assembly," *1991 28th ACM/IEEE Design Automation Conference*, Paper41.5, pp. 736–739.
Eades et al. "How to Draw a Directed Graph," *1989 IEEE Workshop on Visual Languages*, pp. 13–17.
Gedye et al. "Browsing the Chip Design Database," *1988 25th ACM/IEEE Design Automation Conference*, Paper 20.3, pp. 269–274.
Hou et al. "DECOMPOSER: A Synthesizer for Systolic Systems," *1988 25th ACM/IEEE Design Automation Conference*, Paper 40.5, pp. 650–653.
Hsiao et al. "An Edge–Oriented Compaction Scheme Based on Multiple Storage Quad Tree," *ISCAS '88*, pp. 2435–2438.
Lo et al. "An O(n$^$ 1.5 logn) 1–d Compaction Algorithm," *1990 ACM/IEEE 27th Design Automation Conference*, pp. 382–386.
Marple "A Hierarchy Preserving Hierarchical Compactor," *1990 27th ACM/IEEE Design Automation Conference*, Paper 22.2, pp. 375–381.
Reichelt et al. "An Improved Cell Model for Hierarchical Constraint–Graph Compaction," *1986 IEEE Int'l Conference on Computer–Aided Design*, pp. 482–485.

*Primary Examiner*—Kevin J. Teska
*Assistant Examiner*—Leigh Marie Garbowski
*Attorney, Agent, or Firm*—Fenwick & West LLP

[57] ABSTRACT

A method and system provide for the symbolic design of a symbolic layout of an integrated circuit using only the topological features of the cells of the layout, absent geometrical information. Virtual leaf cells define circuit elements, and virtual hierarchical cells combine virtual leaf cells and other virtual hierarchical cells into hierarchical arrangements using interface graphs. Virtual interfaces describe the connectivity and orientation relations between virtual cells. The interfaces inherit the definitional requirements of interfaces at lower levels. The symbolic layout is produced from a hierarchy of virtual cells using hierarchical compaction and routing technology.

22 Claims, 6 Drawing Sheets

VIRTUAL INTERFACE REPRESENTATION OF HIERARCHICAL SYMBOLIC LAYOUTS

RELATED APPLICATION

This application is related to the application Ser. No. 07/889,831, filed on May 26, 1992 by Cyrus Bamji and Ravi Varadarajan, entitled *Hierarchical Pitchmatching Compaction Method and System for Integrated Circuit Design,* which is incorporated by reference herein.

BACKGROUND

1. Field of the Invention

The present invention relates generally to the field of automated design techniques for electronic circuits, and more particularly to methods and systems for representing very large scale integrated circuit layouts.

2. Description of the Background Art

The physical design of an integrated circuit is generally carried out in terms of the symbolic layout of the topology of the circuit, rather than the actual geometry of the masks and layers that comprise the chip. When creating mask works for integrated circuits, designers typically begin with a circuit schematic 20 consisting of an interconnected network of logic or circuit elements. The designer typically uses a library of mask work patterns or "cells" that correspond to the various circuit elements used in the design. Creating a mask work then consists of transforming the circuit schematic by substituting various cells for the schematic circuit elements in such a way as to provide efficient use of available mask area. The designer can thus work with transistors, wires, and other primitive components, and groups of these components using symbolic representations of these circuit elements. The symbolic layout provides a higher level of abstraction than the mask layout, and is therefore easier for the designer to manipulate. The layout designer is thus allowed to concentrate more on the topological aspects of the circuit design rather than on the spacing requirements of the fabrication technology.

A symbolic cell representation that contains only primitive symbols—i.e. transistors, wires, capacitors and other physical components—is termed a "leaf cell." The connections between cells are made with ports, otherwise known as pins. Leaf cells generally contain rigid geometrical features that define their physical shape, such as definite distances between the ports of the cell.

Many layouts contain a large number of groups of components that are substantially identical. Such a group may be used to define a cell, and the description of the layout may then be simplified by treating each such group as an "instance" of this cell. The cell has its own symbol; for example it may be represented as a rectangle with various ports for connecting wires or for abutment with ports of adjacent cells that are represented similarly. The components of the overall layout then may consist of many cells, and the layout represents their relative placement and interconnection. Describing the layout in terms of cells rather than primitive symbols, further simplifies the designer's task.

Obviously this process of grouping elements and cells may be repeated, so that a symbolic layout can be treated as a hierarchical structure with multiple levels. Each level is a symbolic layout of various cells and primitive components. Each such cell in a level is in turn a symbolic layout of subcells and primitive components, and this layout defines the next lower level of the hierarchy. Since there may be more than one type of cell at any given level, the next lower level may contain several different branches. The cells at the lowest level are the leaf cells since they contain no subcells, but only primitive components. Cells at any other level are "hierarchical cells." The hierarchy can be visualized as an inverted "tree" with branches extending downward, and the lowest level depends on the branch in which it is located. In short, the leaf cells are located at the ends of the branches, and the trunk of the tree represents the symbolic layout of the whole chip, which is often termed the "root cell." This hierarchical description is a natural and concise representation for large designs.

Once the design of the layout is completed, it is tested to verify its logical functioning. Any defective operation is remediated by design changes and reverified. The layout is then compacted, or translated into a mask layout suitable for the actual fabrication of the chip. Compaction maps the symbolic representation of the layout into a physical structure that implements the function of the layout using a specific fabrication technology, while preserving both the topological and geometrical design rules. For example, with semiconductor chips, compaction specifies the configuration of the geometrical structure of the circuit, identifying the precise placement and relationship of the various layers of semiconductors, insulators, substrates and the like. Using the compacted layout, the masks for the circuit are prepared and the circuit fabricated. The fabricated circuit is tested to verify its functional operation. Changes are made to the symbolic layout in order to remediate discrepancies between the intended and actual operation of the circuit, and a new mask work and chip is fabricated. This design and verify process is repeated until the chip operates as intended.

For the symbolic methodology to be effective, it is imperative that the symbolic layout and compaction system handle a variety of design styles. The ability to handle large hierarchical designs is essential. In most hierarchical compaction systems, the connectivity of the circuit elements is implicit in the symbolic layout. Connectivity is extracted from the symbolic layout based on the input topology and is preserved during the compaction process. This is true for both connectivity inside leaf cells as well as the hierarchical connectivity across cells. This implicit representation of connectivity in the symbolic layout causes geometric information to creep into the otherwise topological symbolic layout. Though this may be acceptable for leaf cells, it has serious draw backs in designing hierarchical layouts, and significantly reduces the effectiveness of the symbolic methodology. When leaf cells are designed for use in hierarchical layouts, the position of pins or ports in these cells, that connect to other cells is constrained by the abutment requirements. This is because when cells are placed in a particular configuration during the symbolic design of hierarchical layouts, s the connectivity across cells is implicit by overlapping of symbols. Hence the pin or port positions for the cells must be decided before the actual symbolic layout of leaf cells which can lead to sub-optimum designs.

FIG. 1 shows a hierarchical layout containing two instances of two leaf cells A and B, with abutting pins 11. Each leaf cell contains geometrical information specifying its size along the x and y axis, and the spacing requirements d(1) and d(2) between the pins 11. Due to the abutting requirements between the pins 11 on the common boundary 13, the relative position of these pins 11 in the two cells should be the same. Determining these pin positions in the overall layout, consistent with numerous other leaf and hierarchical cells, with conventional symbolic representation and compaction is difficult and often requires multiple iterations. Moreover, the placement of the pin positions in the symbolic layout constrains the design of each leaf cell, reducing the flexibility and reusability of the leaf cell in other circuit implementations. Another significant disadvantage with conventional approaches is that engineering change orders (ECO's) become very difficult to incorporate into an existing layout. Once the hierarchy has been built, it is very tedious to make any changes to one of the leaf cells which would require its size or the position of one of the pins or ports to change. The change in the pin position in one of the leaf cells would cause a rippling effect in other cells and in some cases the whole hierarchy may have to be redesigned, at a significant cost.

It is desirable therefore to provide a method of symbolically representing a circuit layout that separates the layout design process into topological and geometrical design stages. Such a bifurcated design process has two distinct advantages. First, it offers process independence. The same topological or symbolic design can be targeted to many different processes since the specific geometric constraints for a given fabrication technology are not incorporated into the symbolic layout. Process independence is important for fabless semiconductor companies, as the binding to a specific technology can be delayed to later in the design cycle. The second advantage is that it allows higher level tools such as layout synthesis and layout generators to compile into the more abstract intermediate representation without having to be concerned with the exact design rules. Design space exploration is facilitated since different topologies can be generated more easily.

In order to provide for a distinct topological design stage, it is desirable to provide a method for representing the topological structure and their connectivity relations of a circuit layout without deriving the structure from the geometrical features of the cells. What is further needed is a method of representation that is devoid of geometrical information at the hierarchical cell level, and hence produces a true symbolic format, whereby intercell connectivity requirements are explicitly captured by the connections between cell instances in the hierarchy, leaving considerable freedom for the design of the leaf cells. Such a method should provide all the necessary information for producing a compacted hierarchical layout without specifying the geometrical features of the layout.

SUMMARY OF THE INVENTION

The present invention provides a method and system for symbolically representing a circuit layout using only topological and connectivity information. The designer of a circuit layout defines any number virtual cells, which are topological constraint models of circuit elements. A number of instances of virtual cells are created for actual placement in the circuit layout. In order to provide the necessary placement information for the instances, interfaces between the virtual cells are defined, and instances of the virtual cells are coupled with the interfaces. The interfaces contain the necessary information to define the relative positioning of each virtual cell instance in the layout using interface transforms. A further refinement of the method involves defining the virtual cell as virtual hierarchical cell using an interface graph that includes instances of other virtual cells (either virtual leaf cells or virtual hierarchical cells) and virtual interfaces coupling such instances. The virtual interfaces may be defined for virtual leaf cells as identifying a pair of virtual leaf cells and some pin binding pair between the virtual leaf cells. The virtual interfaces may also be defined for virtual hierarchical cells as identifying a pair of instances of virtual cells and a virtual cell interface coupling said instances. This method thus provides for the construction of multi-level hierarchical layouts of virtual cells based on other virtual cells. A further refinement of the method, the designer may associate an orientation with an instance of a virtual cell or with an interface to further specify the relative positioning of two cells, and may associate an interface type with an interface, defining the interface type as either abutment or routing. These aspects of the method afford the designer greater flexibility in constructing the circuit layout.

Applied more elementally, the method of the present invention is used to define individual circuit elements with only topological and connectivity information. The designer defines individual circuit elements by selecting circuit objects, defining a connectivity relationship between the selected circuit objects and providing spacing constraints between the circuit objects. Since no exact geometrical information is present, the circuit element can be reused in various circuit layouts, or redesigned without requiring redesign of the entire layout because of changes in geometrical values. This method can then be extended to form an entire layout by forming additional circuit elements as above, so that the designer selects pairs of such elements, and defines an interface relationship between a pair of circuit elements. The designer may then form hierarchical circuit elements from sets of other circuit elements, and define various interface relationships between selected hierarchical circuit elements.

A design tool is also provided for symbolically representing a circuit layout. In one embodiment the design tool includes a first means that receives a stored symbolic cell and defines therefrom a virtual cell, a second means that defines a virtual interface, a third means that retrieves a virtual cell and creates an instance of the virtual cell in a layout database, and a fourth means that couples selected instances of virtual cells. As a further refinement of the design tool, the first means additionally includes a means that defines virtual leaf cell containing a topological constraint model and a means that defines a virtual hierarchical cell using an interface graph. Another refinement of the design tool includes in the second means a means that defines an interface for a pair of virtual leaf cells, and a means that defines an interface for a pair of virtual hierarchical cells.

These and other embodiments of the invention as further described herein by the following figures and disclosure. It is understood by those of ordinary skill in the art that the figures illustrated herein are abstractions of circuit layouts and circuit elements, and are meant to show the features and advantages of the invention without unnecessary detail.

DESCRIPTION OF THE PREFERRED EMBODIMENT

The virtual interface method and design tool uses the interface graphs as described and applied in the patent application Ser. No. 07/889,831 for *Hierarchical Pitch-matching Compaction Method and System for Integrated Circuit Design,* referenced above. The virtual interface method provides a direct representation of the topological layout from which a compacted output can be readily produced by a hierarchical compactor, such as that described in the copending application. This virtual interface representation allows for the cells in the hierarchical layout to be created with "virtual cells" that are elastic topological objects, without the rigid geometrical properties of conventional layout cells. The type of connection between cells in the hierarchy, abutting or routing, is captured by "virtual interfaces." Virtual cells include virtual leaf cells and virtual hierarchical cells. The virtual interfaces thereby comprises both virtual leaf cell interfaces and virtual hierarchical cell interfaces. The virtual cells contain the minimum amount of information necessary to produce a compacted hierarchical layout using hierarchical compaction. Thus hierarchical compaction will determine the position of primitive objects and circuit elements within each virtual cell, as well as the locations of the instances of the virtual cells in all levels of the layout hierarchy, producing a full specified and compacted layout.

In the virtual interface method of the present invention the virtual cells can be constructed according to any number of design rules. However, the virtual cells are constructed without geometrical information about the exact location of elements in the cell. Virtual leaf cells contain only topological and spacing constraint information, and are devoid of any geometrical information, such as exact locations of pins or other circuit elements. Virtual hierarchical cells are composed of connected virtual leaf cells and other virtual hierarchical cells. The instances of virtual cells inside of a virtual hierarchical cell have no placement information with respect to the virtual hierarchical cell. The interfaces between virtual cells are "virtual" because the geometrical information instantiating the connectivity relations is unspecified. In particular, the interface transforms are unknown during the virtual interface design process. In contrast, in conventional layout methods, the interfaces contain the geometrical information for the connectivity relations, even though those relations are generally disposed of during compaction. The virtual cells and interfaces are stored in appropriate data structures in a cell library for use during the design of a symbolic layout.

Figure 1:
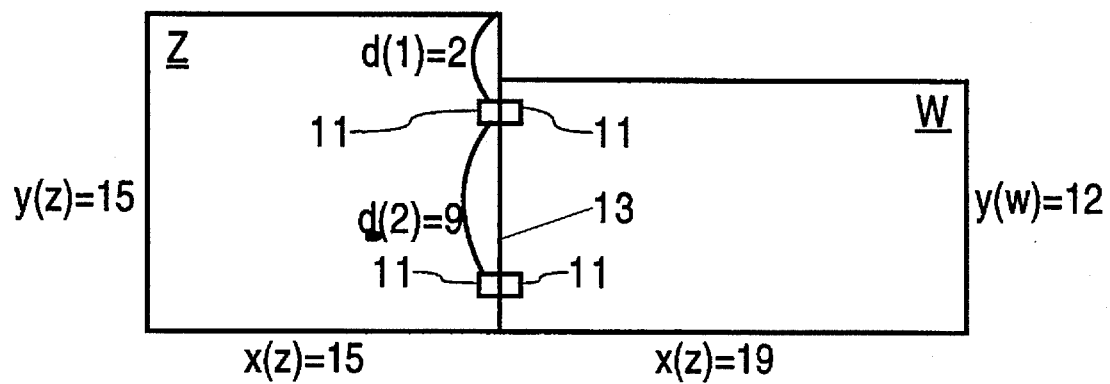
FIG. 1 is a pictorial illustration of a layout schematic containing two cells.
Figure 2:
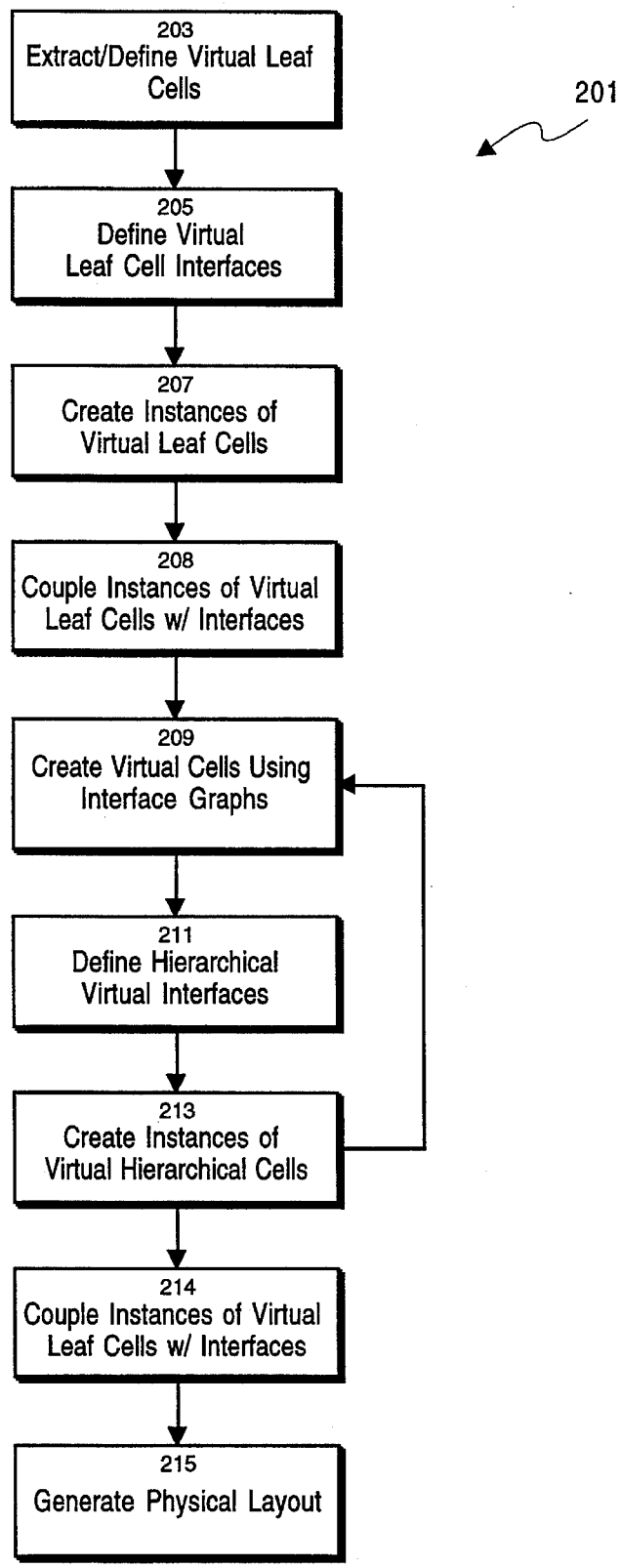
FIG. 2 is a flowchart of a method for representing hierarchical layouts using virtual interfaces.

Referring now to FIG. 2, there is shown a flowchart of the virtual interface method 201 of one embodiment of the present invention. This method produces a symbolic layout fully describing the topological structure of an integrated circuit, from which a compacted and translated layout can be created and then fabricated in a desired technology.

Figure 3A:
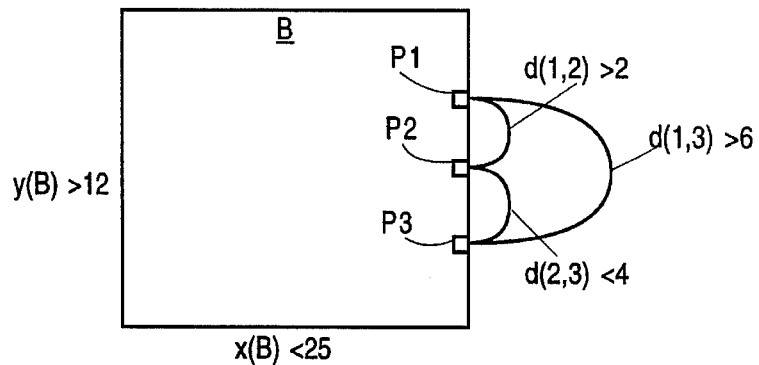
FIGS. 3A, 3B, and 3C are pictorial illustrations of a hierarchical virtual cell and an interface graph.

The virtual interface method 20 1 begins with the definition 203 of a set of virtual leaf cells for use in constructing a layout for an integrated circuit. The virtual leaf cells can be either created as needed by the circuit designer, or based on a library of existing leaf cells, or both. In the preferred embodiment, the virtual leaf cells are extracted from an existing physical layout or library of symbolic leaf cells. Alternatively, virtual leaf cells can be defined 203 ab initio using conventional connectivity based layout languages. Any number of virtual leaf cells may be created for use in the layout. FIG. 3A shows a virtual leaf cell B having pins P; only the spacing constraints d between the pins P, and the topological structure of the virtual leaf cell, are specified. A virtual leaf cell may be viewed as a constraint graph containing selected circuit objects in the circuit layout with only spacing constraints between the circuit objects, without any specification of the geometric coordinates of the objects in the circuit layout.

Next, virtual leaf cell interfaces connecting virtual leaf cells are defined 205. The virtual leaf cell interface defines a particular connection pattern and a legal relative positioning of virtual leaf cells B and C. More precisely, virtual leaf cell interface I is a list of specific pin binding pairs for pins of two virtual leaf cells B and C, and an orientation, which is a description of the relative positioning constraint of one virtual leaf cell with respect to the position of another. Each pin binding pair can be defined as a couple $\{P(B,i)), P(C,j)\}$ where $P(B,i)$ and $P(C,j)$ are connected pins of virtual leaf cells B and C, respectively. Virtual leaf cells B and C may have more than one defined virtual leaf cell interface between them, in s which case the virtual leaf cell interfaces are labeled $I_1(BC)$, $I_2(BC)$, $I_3(BC)$, and so on, and thus any number of interfaces between cells can be defined 205.

Figure 3B:
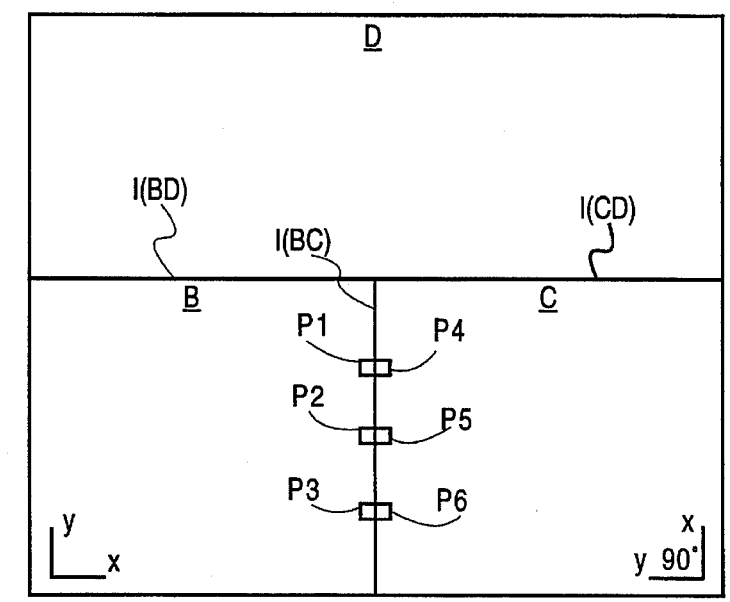

FIG. 3B shows instances of virtual leaf cells B, C and D within virtual hierarchical cell A, along with the three virtual leaf cell interfaces I(BC), I(CD), and I(BD). Virtual leaf cell interface I(BC) lists the pin binding pairs of virtual leaf cells C and B, shown here as the couples {P(B,P1), P(C,P4)}, {P(B,P2), P(C,P5)}, and {P(B,P3), P(C,P6)}, and the orientation of virtual leaf cell C with respect to virtual leaf cell B, shown here as cell C being rotated 90° with respect to cell B, as represented by the x-y axes in each cell. Any orientation in the plane of the circuit can be described including rotations and reflections. The virtual leaf cell interfaces I(CD) and I(BD) are similarly defined.

The connections defined in each virtual leaf cell interface may be realized by abutment or by routing, either of which can be represented as part of the virtual interface. If the connections of an interface I(BC) between virtual leaf cells B and C are to be realized by abutment then all the connections emanating from cell B (respectively C) must come from the same side of cell B (respectively C). Additionally, all the pins P in cell B (respectively C) participating in the virtual leaf cell interface must be on the periphery and on the same side of cell B (respectively C). The abutment requirement further imposes that along the common side of cells B and C in the virtual leaf cell interface I(BC), the order of the pins P must be the same. The internal constraints within cells B and C impose a partial ordering on the pins of these cells. Because the order of pins along the interface boundary must be the same, the partial ordering constraints on the pins must be consistent. Thus, in the example of FIG. 3B, the pins of virtual leaf cell B are ordered (P1, P2, P3), and so the order of the connected pins in virtual leaf cell C must also be the same, i.e. (P4, P5, P6). In addition to abutment interfaces, routing interfaces requiring routing of connections between cells can also be represented in the virtual interface by relaxing some of the interface constraints described above.

Once a number of virtual leaf cells and virtual leaf cell interfaces have been defined, various instances of the virtual leaf cells are created 207. These instances represent the actual circuit elements to be used in the layout. The instances of the virtual leaf cells have no placement information but rather their relative positioning is defined by the interfaces between them. Various instances of virtual leaf cells can then be coupled 208 through the use of virtual interfaces.

With the instances of the virtual leaf cells and the virtual leaf cell interface, numerous distinct virtual hierarchical cells are created 209 using interface graphs to represent the intercell connections between instances of the virtual leaf cells. Such a virtual cell is a hierarchical cell because it is defined using the connectivity relations of a number of leaf cells.

Generally, an interface graph is a directed graph in which the vertices represent instances of cells (either leaf cells or hierarchical cells) and the edges represent interfaces I between such instances. Interface graphs can represent both hierarchical cells and mixed cells, consisting of instances of other cells and primitive geometries, using the hierarchy normalization technique described in the related application referenced above, *Hierarchical Pitchmatching Compaction Method and System for Integrated Circuit Design*. An interface graph represents a family of layouts all of which are translations and rotations of one another. The interface graph is transformed into one of its layout equivalents via an interface graph to layout transformation, such as that introduced in the related application. The transformation determines the proper placement of each cell instance in the layout that corresponds to a vertex in the interface graph. This process corresponds to giving a placement to each vertex in the graph. The transformation starts by giving an arbitrary placement to some arbitrary vertex V in the interface graph. The placement of all the neighboring vertices of V are then derived from the placement of V and the virtual interface between V and each of them. The placement of each of the remaining vertices can then be defined using the same process.

In the present invention, interface graphs are used to identify the instances of the virtual cells appearing in the virtual hierarchical cell and the virtual interfaces that connect pairs of virtual cells. The virtual cells can be either virtual leaf cells or other virtual hierarchical cells, and the virtual interfaces can be either virtual leaf cell interfaces, or virtual hierarchical interfaces. Using interface graphs to define virtual hierarchical cells ensures that such cells contain only topological information, thereby allowing improved reusability and design flexibility.

Figure 3C:
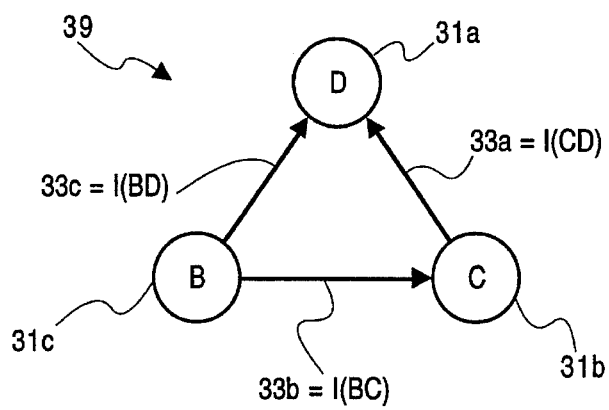

FIG. 3C shows the interface graph 39 for the layout of FIG. 3B. Each vertex 31 corresponds, and is labeled to indicate an instance of a virtual leaf cell. Thus vertices 31 are labeled D, C, and B, respectively. The edges 33 connecting vertices 31 are labeled with the corresponding virtual leaf cell interfaces I between the instances of the virtual leaf cells, signifying that the two virtual leaf cells are to be connected using the connection pattern defined in virtual leaf cell interface I. Thus edge 33*a* is labeled and associated with virtual leaf cell interface I(DC), and so on for each edge 33.

A plurality of virtual hierarchical cells can be created 209 using interface graphs. Also, virtual hierarchical cells can be extracted from an existing layout, in the same way as the virtual leaf cells are defined, as described above. It is then appropriate to define 211 a virtual hierarchical interface. The definition of a virtual hierarchical interface parallels the definition of a virtual leaf cell interface, in that it is a list of connections between two virtual hierarchical cells. Thus, where the virtual leaf cell interface I(AB) of virtual leaf cells A and B specifies the pin binding pairs and the orientation of virtual leaf cells A and B, the virtual hierarchical interface I(CD) of virtual hierarchical cells C and D specifies the connections between instances of virtual leaf cells A and B in the virtual hierarchical cells C and D and the orientation of these cells. In the definition of the virtual hierarchical interface, the virtual leaf cell instances play the role of the pins in a virtual leaf cell interface. FIG. 4 illustrates the relationship of a virtual leaf cell interface and a virtual hierarchical cell interface.

Figure 4A:
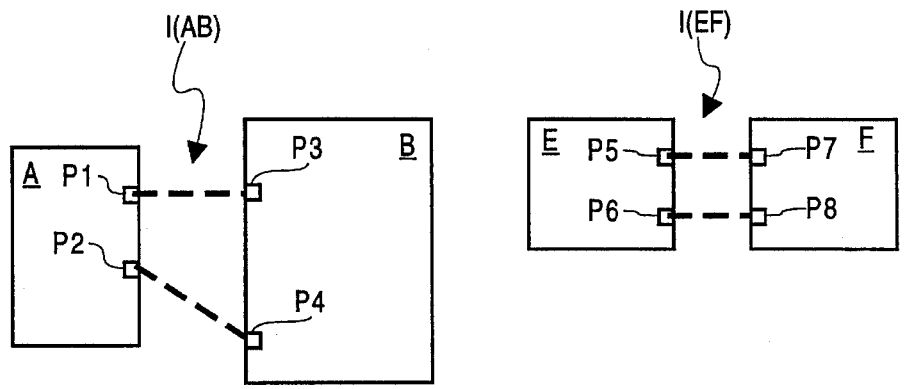
FIG. 4A is a pictorial illustration of two pairs of virtual cells.
Figure 4B:
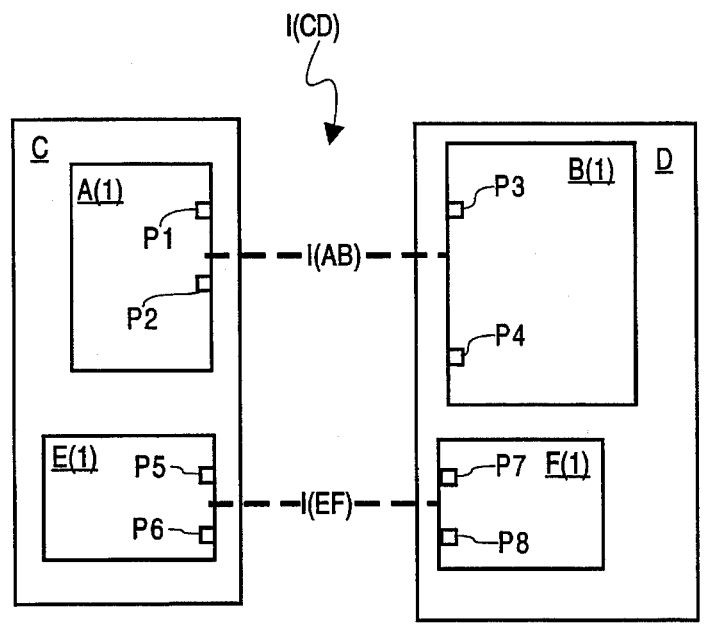
FIG. 4B is a pictorial illustration of two hierarchical virtual cells including the virtual cells of FIG. 4A.

In FIG. 4A there is shown virtual leaf cells A and B coupled via virtual leaf cell interface I(AB), and virtual leaf cells E and F, coupled via virtual leaf cell interface I(EF). Virtual leaf cell interfaces I(AB) and I(EF) are defined by the respective pin binding pairs {P(X,i), P(Y,j)} of each of the respective virtual leaf cells. Thus virtual leaf cell interface I(AB) comprises the pin binding pairs {P(A,P1), P(B,P3)} and {P(A,P2), P(B,P4)}. Virtual leaf cell interface I(EF) comprises the pin binding pairs {P(E,P5), P(F,P7)} and {P(E,P6), P(F,P8)}. FIG. 4B shows the virtual hierarchical interface I(CD) between virtual hierarchical cells C and D, where cell C is made up of virtual leaf cell instances A(1) and E(1), and cell D is comprised of virtual leaf cell instances B(1) and F(1). The virtual hierarchical interface I(CD) is defined in terms of virtual leaf cell interfaces I(AB) and I(EF) between the instances in cells C and D and defines how some of the instances in cell C are connected to the instances in cell D. The virtual hierarchical interface definition of I(CD) is a list of connections between the two sets of virtual instances specifying which of the instances in cells C and D are connected, and how they are connected together. Thus, in FIG. 4B instances A(1) and B(1) are placed in cell C and D respectively, and the electrical connection between instances A(1) and B(1) is defined by an virtual leaf cell interface I(AB) between A(1) and B(1). Likewise, instances E(1) and F(1) are coupled by virtual leaf cell interface I(EF). Hence the virtual hierarchical interface I(CD) can be defined by a list of binding triplets {A(1),B(1),I(AB)} and {E(1), F(1), I(EF)}. The relative orientation of cells C and D in virtual hierarchical interface I(CD) is also stored. The orientations should be consistent with the orientations of the virtual instances in cell C and D and the virtual interfaces between them.

If virtual hierarchical interface I(CD) is to be realized by abutment then the pin constraints described above apply to the corresponding cell instances. In addition, for each binding triplet {A(1),B(1),I(AB)} in the definition of virtual hierarchical interface I(CD), virtual leaf cell interface I(AB) must be realizable by abutment. Furthermore, the interface inheritance relation on the orientations of A and B must be satisfied. The interface inheritance relations are described in C. Bamji and R. Varadarajan, *Hierarchical Compaction Using Minimum Design*, ACM IEEE 29th Design Automation Conference, 1992.

As with the virtual leaf cells, a plurality of instances of virtual hierarchical cells are also created 213 as needed to form various functional groups in the layout. The entire layout can then be designed by repeating steps 209 to 213, that is, by building further virtual hierarchical cells using previously defined instances of virtual leaf cells, virtual hierarchical cells, and virtual interfaces. Because the virtual hierarchical interfaces are defined using previously defined virtual cells and interfaces, they set up a recursive system of constraints in which the electrical connections in the virtual hierarchical interfaces are defined in terms of the electrical connections of the virtual leaf cell interfaces. By unraveling the levels of recursion in the definition of a virtual hierarchical interface I(CD), the connections between primitive geometries multiple levels down in the hierarchies of cells C and D can be obtained during compaction. Conversely, from a list of pin bindings between pins of the virtual leaf cells along with the inheritance relations between the virtual hierarchical cells, the virtual hierarchical interface can be reconstructed.

Figure 4C:
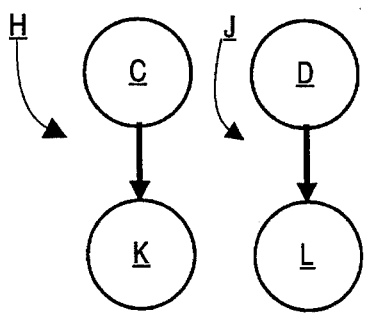
FIG. 4C is a pictorial illustration of interface graph of the hierarchical virtual cells of FIG. 4B.
Figure 4D:
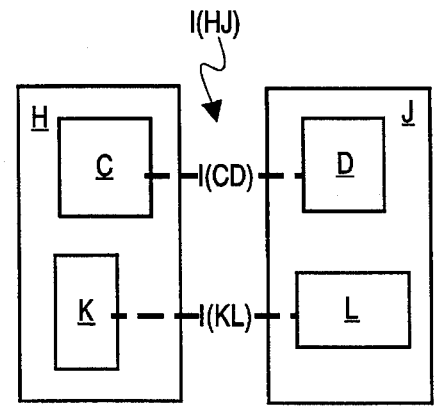
FIG. 4D is a pictorial illustration of a hierarchical virtual cell including the hierarchical virtual cells of FIG. 4B.

FIGS. 4C and 4D shows an example of the repeated application of the steps 209 to 213. In FIG. 4C, a virtual hierarchical cell H has been created 209 by defining an interface graph between an instance of virtual hierarchical cell C of FIG. 4B and an instance of an arbitrary virtual hierarchical cell K, along with a previously defined virtual interface between them. Similarly, virtual hierarchical cell J has been defined by an interface graph relating an instance of virtual hierarchical cell D and an instance of an arbitrary virtual hierarchical cell L, again using a previously defined virtual interface. FIG. 4D shows an example of the application of step 211 to create a virtual hierarchical interface I(HJ) between virtual hierarchical cells H and K using virtual hierarchical interfaces I(CD) and I(KL).

Once the layout has been completed using the virtual interface representation, the layout is compacted 215 by a hierarchical compactor. During hierarchical compaction, only the interfaces to be realized by abutment are considered. The constraints from interfaces to be realized by routing are ignored. This corresponds to hierarchically compacting a disconnected layout comprised of hierarchical cells. Connections within the hierarchical cells are achieved by abutment and are enforced by the compactor. Connections between the hierarchical cells are to be established through the use of a place and route system which is applied to the collection of disconnected hierarchical cells. Accordingly, leaf cell uniqueness is preserved across the hierarchical cells. If a same leaf cell A appears in several of the hierarchical cells then a same compacted version of A will appear in each of the compacted hierarchical cells. After hierarchical compaction has generated the compacted hierarchical cells, place and route engine(s) can be used to route the layout, producing a final compacted layout.

As mentioned above, the present invention can take a physical layout and extract virtual cells from existing symbolic leaf cells and hierarchical cells in cell libraries or existing layouts. In addition, virtual interfaces may also be extracted from an existing layout, thereby creating an entire virtual interface hierarchy. Once this virtual interface hierarchy has been built, any one of the cells in this hierarchy can be used as building blocks for new virtual cells. The extracted cells can be treated as any other virtual cells and can be composed with other virtual cells, which may or may not be extracted. Through this mechanism investment in existing physical layouts can be utilized and some of the advantages of the virtual interface representation can be applied to existing physical layouts. Blocks of layout that do not initially abut can be stretched and abutted. In this scheme, a virtual interface representation of the two blocks is first extracted. Virtual interfaces are then defined 205 between the two blocks and a virtual cell containing instances of both blocks and the appropriate interface between them is then created 209. Finally the hierarchical compaction 215 is performed to yield an abutted physical layout.

Figure 5A:
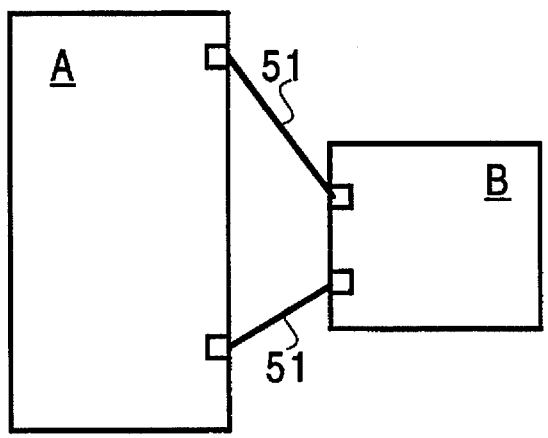
FIG. 5A is a pictorial illustration of two cells in an existing layout.
Figure 5B:
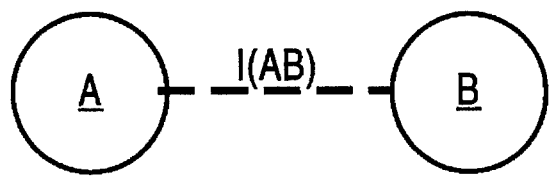
FIG. 5B is a pictorial illustration of an extracted interface graph of the hierarchical cells of FIG. 5A.
Figure 5C:
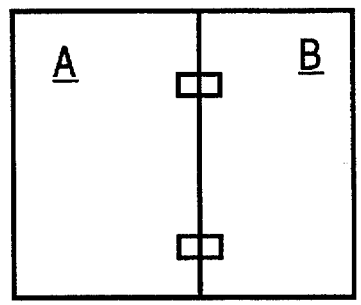
FIG. 5C is a pictorial illustration of the hierarchical cells of FIG. 5A after stretching and abutting.

FIG. 5A shows two hierarchical cells A and B with different sizes, with connection lines 51 indicating connection intent. FIG. 5B shows the virtual interface representation obtained by extracting a virtual interface representation for each cell and connecting the two cells by an virtual interface I(AB). FIG. 5C shows the results of stretching and abutting the cells of the layout after applying hierarchical compaction.

Figure 6:
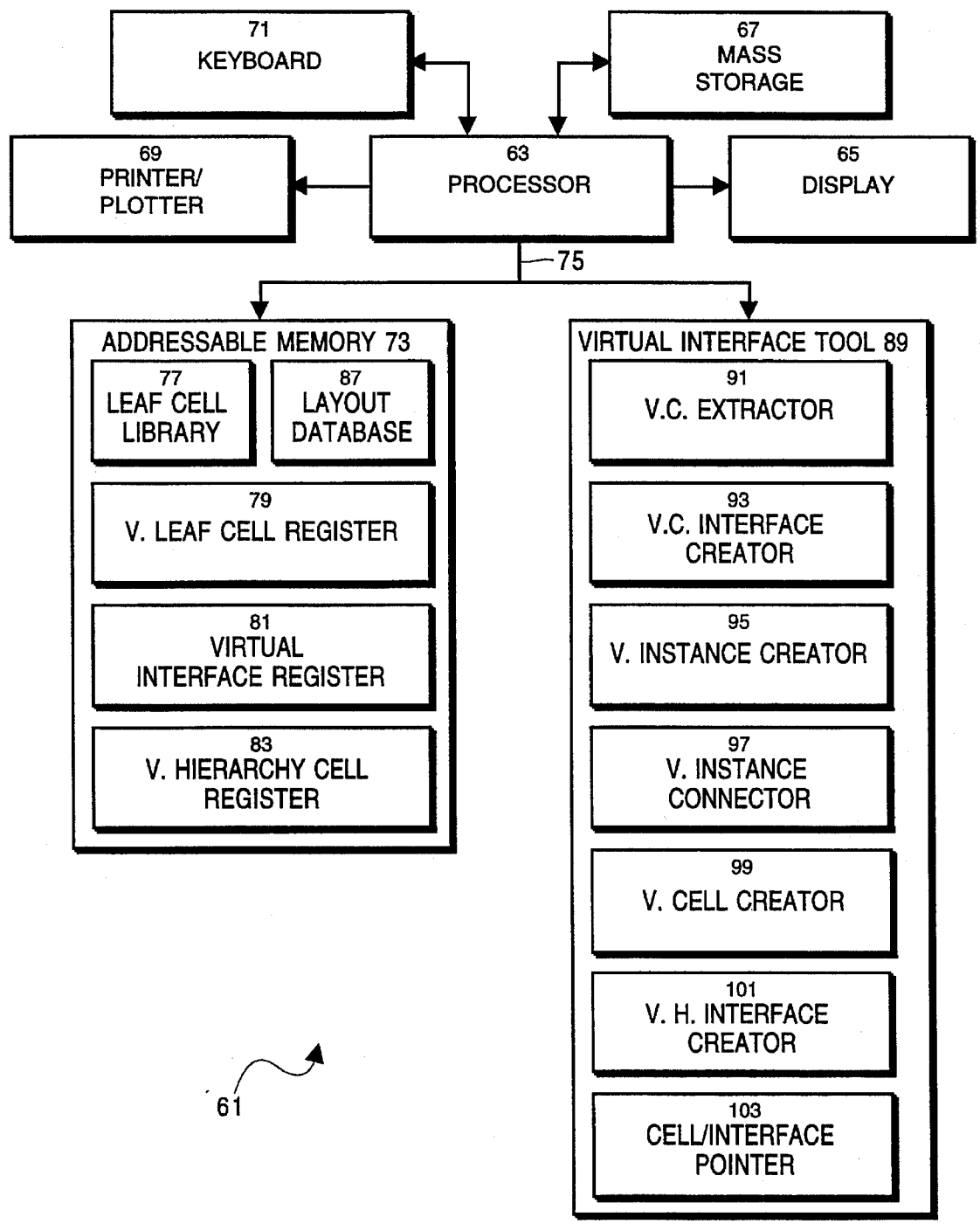
FIG. 6 is a block diagram of a system for representing hierarchical cells using virtual interfaces.

Referring now to FIG. 6, there is shown a pictorial illustration of a system for designing a symbolic layout of an electrical circuit using a virtual interface representation. The preferred embodiment is implemented on a general purpose computer such as a Sun Microsystems, Inc. workstation. Utilizing dedicated software embodying a virtual interface tool 89, the general purpose computer specifically configures memory and system peripherals for the purpose of executing the method of the present invention.

Virtual interface representation system 61 comprises a processor 63, a display 65, a mass storage device 67, a printer 69, a keyboard 71, a virtual interface tool 89 and an addressable memory 73. The keyboard 71 and display 65 provide a user interface to the virtual interface tool 89, the former allowing a designer to operate the virtual interface tool 89, and the later allowing the designer to view a graphic representation of the cells and layout as he is creating them. The printer 69 generates a permanent record of the symbolic layout.

The processor 63 is connected to various memories in the addressable memory 73 through a data bus 75. Connected to the data bus 75 are a leaf cell library 77, a virtual leaf cell register 79, a virtual interface register 81, a virtual hierarchical cell register 83, and a layout database 87. Each of these memories is accessed by the processor 63 to obtain and store information according to the operations of the functions of the virtual interface tool 89.

The leaf cell library 77 contains a collection of leaf cells that can be used to create the virtual interface representation of an integrated circuit. The leaf cells contained therein describe the physical layout of the cell, and are used by the virtual cell extractor 91 to derive the virtual leaf cell representation described above. The layout database 87 contains the symbolic description of the layout as it is being created. Following compaction, the layout database 87 also contains the compacted layout.

The virtual interface tool 89 is coupled to the processor 63 by the data bus 75, and provides a set of program modules for implementing the virtual interface representation method described above. The modules are accessed by the processor 63 in response to inputs by the designer from the keyboard 71 (or any other input device, such as a mouse, electronic stylus, or the like) and perform various operations, storing the results in the appropriate memory registers in the addressable memory 73. When necessary, the processor 63 displays the results of an operation on the display 65.

In the preferred embodiment, the virtual interface tool 89 includes the following functions:

A virtual cell extractor 91 creates a virtual cell representation from the physical layout of a cell stored in leaf cell library 77. The cell may be either a leaf cell or a hierarchical cell. In the case of a leaf cell, this function creates a topological constraint model of the leaf cell, which is stored in virtual leaf cell register 79. For a hierarchical cells, the virtual cell extractor 91 creates the interface graph of the cell, which is stored in virtual hierarchical cell register 83.

The representations for all the subcells are also automatically created and stored. In the preferred embodiment, the virtual cell extractor 91 is used to implement the extraction 203 of virtual leaf cells.

A virtual leaf cell interface creator 93 creates a virtual leaf cell interface between two leaf virtual cells when passed the two virtual leaf cells that participate in the interface, the orientations of the virtual leaf cells, and the type of interface (abutting, routing). It includes a function for associating with the interface pairs of pin bindings between the pins in the two cells. The virtual interface register 81 stores the virtual leaf cell interfaces for various pairs of virtual leaf cells stored in virtual leaf cell register 79. The interfaces can be stored according to the interface descriptions provided above, or any other interface description providing the same topological information. In the preferred embodiment, the virtual leaf cell interface creator 93 is used to implement the definition 205 of virtual leaf cell interfaces.

Virtual instance creator 95 creams an instance of a virtual cell when passed the virtual cell that needs to instantiated, and a pointer to the virtual cell that contains the instance and orientation of the instance. The instance is stored in the layout database 87 by the processor 63. In the preferred embodiment, the virtual instance creator 95 is use to implement the creation 207, 213 of instances of both virtual leaf cells, and virtual hierarchical cells.

Virtual instance connector 97 connects two instances of virtual cells by a referenced virtual interface; the layout database 87 is updated by the processor 63 to include the virtual interface. In the preferred embodiment virtual instance connector 97 implements the coupling 208,214 of both virtual leaf cells and virtual hierarchical cells.

A virtual cell creator 99 creates and initializes the interface graph representation of a virtual hierarchical cell in an appropriate data structure. The virtual instances and their appropriate interfaces are added to the interface graph by other functions. The virtual hierarchical cell is stored in virtual hierarchical cell register 83. In the preferred embodiment, virtual cell creator 99 implements the definition 209 of virtual hierarchical cells.

Virtual hierarchical interface creator 101 creates a virtual hierarchical interface between two virtual hierarchical cells when passed the two cells that participate in the interface, the orientations of the cells and the type of interface. This function associates binding triplets that define the interface inheritance relationships between the virtual hierarchical interface and the sub-interfaces with the interface. The virtual interface register 81 stores the virtual hierarchical interfaces. In the preferred embodiment, the virtual hierarchical interface creator 101 implements the definition 211 of virtual hierarchical interfaces.

Cell and interface pointer 103 includes a function to open an already defined virtual cell stored in either the virtual leaf cell register 79 or the virtual hierarchical cell register 83, and returns a pointer to that cell. A second function opens an already defined virtual interface stored in virtual interface register 81 and returns a pointer to that interface. The interface can be either hierarchical or leaf cell interface. These functions are used by the other functions of the virtual interface tool 89 to effect their particular operations in defining, instantiating and coupling cells and interfaces.

These various functions effectuate the method of the preferred embodiment described above. In the preferred embodiment, the functions are implemented using object oriented programming techniques found in Lisp to create virtual cells and virtual interfaces as objects with associated data structures. Other programming languages supporting the data abstraction used here, such as C++, may also be used for implementing the virtual interface tool 89.

The virtual interface representation method thus provides a unified representation which simultaneously allows both abutting and routing strategies and is flexible enough to allow compositions of rigid and flexible cells. There are several of the benefits of this method. Virtual interface representation facilitates the design of library cells. Cells in a library can be treated as flexible cells which need not initially abut. Rather, the library cells can be stretched and distorted as desired to connect with other cells, as described with respect to FIG. 5. Synthesized cells, such as those produced by a layout synthesizer, can be stretched and glued together or used in conjunction with flexible or rigid library cells to produce a hierarchical module. The designer is thus free to cream the topological structure of a layout without consideration of the geometrical limitations that would otherwise be present during conventional symbolic layout. Once the layout is designed, the hierarchical compaction step creates an optimally compacted layout in which cells required to abut do so, fulfilling both the geometrical abutment constraints, and the topological design. Also, unlike a library of rigid cells, no area penalty is incurred for cells or configurations of cells that do not appear in the layout. Through the hierarchical compaction step, virtual interface representation can also be used to create a (stretched and abutted) library of cells that abut, from a library of non-abutting cells.

Virtual interface representation also provides a powerful method for modifying an existing layout. In a layout hierarchy containing connections by abutment, modifications to cells in the hierarchy can be extremely difficult. If the modification causes a cell to increase in size, there may not be enough space to instantiate the modified cell back into the hierarchy and maintain proper connections. With virtual interface representation, the input layout hierarchy is first converted to a virtual interface hierarchy, which can then be modified by changing or modifying some of the cells or by reorganizing the cell connections. Because intercell connections are explicitly captured, cells can be modified, ECO's performed, circuitry added or deleted without destroying the hierarchy.

The virtual interface method frees the designer from having to specify geometrical information during the input of the symbolic layout, especially at the hierarchical level, and thus provides a truly symbolic level of representation. Hierarchical compaction makes this type of representation possible, since it computes the positions of primitive objects within each cell as well as the locations of instances in the cells at all levels of the hierarchy.

Additionally, virtual interface representation facilitates design space exploration at the layout level by allowing the designer to describe the layout at a higher level of abstraction in which geometry is not present. Incremental and local modifications can be performed on the virtual interface hierarchy without compromising the integrity of the representation. A high level tool such as a datapath generator compiling into a virtual interface representation can rapidly try out variations on essentially similar virtual interface hierarchies exploring the design space of different routing,

We claim:

1. A method for symbolically representing a circuit layout comprised of a plurality of circuit elements, the circuit elements defined without geometrical values, the method comprising:

a) defining at least one virtual cell containing a topological constraint model of a plurality of circuit elements, a virtual cell being either a virtual leaf cell or a virtual hierarchical cell;

b) creating at least one instance of a virtual cell, the virtual cell being either a virtual leaf cell or a virtual hierarchical cell;

c) defining at least one virtual cell interface between a pair of virtual cells, and at least one connectivity relationship between the pair of virtual cells; and d) coupling a pair of instances of virtual cells with a virtual cell interface.

2. The method of claim 1, wherein receiving a first user input defining at least one virtual cell containing a topological constraint model of a plurality of circuit elements, further comprises:

defining a virtual hierarchical cell using an interface graph containing instances of virtual cells and virtual cell interfaces coupling pairs of said instances.

3. The method of claim 1 wherein creating at least one instance of a virtual cell includes associating an orientation with the instance of the virtual cell.

4. The method of claim 1, further comprising:

e) repeating steps a) through d) for any number of virtual cells and virtual cell interfaces.

5. The method of claim 1, wherein defining at least one virtual cell interface, further comprises:

defining a virtual leaf cell interface identifying a pair of virtual leaf cells, and at least one pin binding pair coupling the virtual leaf cells.

6. The method of claim 5 wherein defining a virtual leaf cell interface includes associating with said interface an orientation that satisfies any pin binding considerations of the interface.

7. The method of claim 5 wherein defining a virtual leaf cell interface includes associating an interface type with the interface.

8. The method of claim 7 wherein the interface type is either abutting or routing.

9. The method of claim 1, wherein defining at least one virtual cell interface, further comprises:

defining a virtual hierarchical cell interface identifying a pair of instances of virtual cells and a virtual cell interface coupling said instances.

10. The method of claim 9 wherein defining a virtual hierarchical cell interface includes associating with the interface an orientation that is consistent with any orientations of interfaces used to define the virtual hierarchical cell interface.

11. The method of claim 1 further comprising:

compacting the circuit layout using hierarchical compaction techniques to determine placement information for each circuit element and each instance of a virtual cell in the circuit layout.

12. In a computer system for the automated design of electrical circuits including a library of stored leaf cells representative of primitive circuit elements and hierarchical cells, a memory unit for storing data, a processor, and a layout database for storing a symbolic circuit layout having a plurality of cells, a design tool, stored in the memory unit and executable by the processor for symbolically representing the circuit layout, comprising:

a first means, operatively coupled to the library, for receiving therefrom a stored cell, and defining a virtual cell from the stored cell and storing the virtual cell in the memory unit;

a second means for defining and storing in the memory unit a virtual cell interface;

a third means, operatively coupled to the memory unit for retrieving a virtual cell therefrom for creating and storing in the memory unit an instance of the virtual cell in the layout database; and a fourth means operatively coupled to the layout database for coupling instances of virtual cells, and storing the coupling in the memory unit, wherein the processor is operatively controlled by the first, second, third and fourth means in response to user specification.

13. The design tool of claim 12, wherein the first means further comprises:

means for defining and storing in the memory unit a virtual leaf cell containing a topological constraint model of a primitive circuit element stored in the library of leaf cells.

14. The design tool of claim 12, wherein the second means further comprises:

means for defining and storing in the memory unit a virtual leaf cell interface identifying a pair of virtual leaf cells, and at least one pin binding pair; and means for defining and storing in the memory unit a virtual hierarchical cell interface using an interface graph containing instances of virtual cells and virtual interfaces coupling pairs of said instances.

15. The system of claim 12, wherein the first means further comprises:

means for defining and storing in the memory unit a virtual hierarchical cell using an interface graph containing either a) instances of virtual leaf cells and virtual leaf cell interfaces coupling pairs of said instances, or b) virtual hierarchical cells and a virtual hierarchical cell interface coupling said instances.

16. In a computer system for the automated design of electrical circuits including a processor, a cell library of stored cells representative of circuit elements, a layout database for storing a symbolic circuit layout having a plurality of cells, a plurality of memories, a design tool for symbolically representing the circuit layout using virtual cells including virtual leaf cells and virtual hierarchical cells, the design tool comprising:

a virtual cell extractor, executable by the processor for creating a virtual cell containing a topological constraint model from a cell stored in the cell library, virtual cell extractor storing the virtual cell in a virtual cell memory;

a virtual instance creator, executable by the processor for creating an instance of a virtual cell and storing said instance in the layout database;

a virtual instance connector, executable by the processor for connecting a pair of instances of virtual cells with a virtual cell interface; and a virtual cell interface creator, executable by the processor for defining a virtual cell interface between a pair of virtual cells.

17. The design tool of claim 16, wherein the virtual cell extractor further creates from a hierarchical cell stored in the cell library a virtual hierarchical cell using an interface graph to represent cells and interfaces connecting the cells in the hierarchical cell.

18. The design tool of claim 16, wherein the virtual interface creator defines a virtual leaf cell interface between a pair of virtual leaf cells, the virtual leaf cell interface including at least one pin binding pair between the virtual leaf cells, and an orientation of one virtual leaf cell with respect to the other virtual leaf cell.

19. The design tool of claim 16, wherein the virtual interface creator defines a virtual hierarchical interface between a pair of virtual hierarchical cells, the virtual hierarchical interface including at least one pair of virtual cells coupled by a virtual interface.

20. In a computer system for the automated design of an electrical circuit, a cell library including a plurality of stored cells representative of circuit elements, at least one stored cell comprising:

an interface graph containing selected instances of non-primitive circuit elements, the interface graph defining a set of connectivity constraints between the selected instances.

21. A method for symbolically forming a leaf cell comprised of selected circuit objects, the method consisting of the steps of:

a) receiving a first input selecting circuit objects;

b) receiving a second input defining a connectivity relationship between the selected circuit objects;

c) receiving a third user input defining spacing constraints between the selected circuit objects to define a circuit element;

d) defining an interface relationship between at least one pair of circuit elements;

f) forming at least one hierarchical circuit element from at least one set of circuit elements; and g) defining an interface relationship between at least one pair of hierarchical circuit elements.

22. A computer system for the automated design of electrical circuits and for symbolically representing the circuit layout, the system comprising:

a stored library of stored leaf cells representative of primitive circuit elements;

a layout database for storing a symbolic circuit layout having a plurality of cells;

a memory unit for storing data;

means for defining and storing in the memory unit a virtual leaf cell containing a topological constraint model of a primitive circuit element stored in the library of leaf cells;

means for defining and storing in the memory unit a virtual leaf cell interface identifying a pair of virtual leaf cells, and at least one pin binding pair;

means for creating and storing in the memory unit an instance of a virtual leaf cell in the layout database;

means for coupling instances of virtual leaf cells, and storing the coupling in the memory unit;

means for defining and storing in the memory unit a virtual hierarchical cell using an interface graph containing either a) instances of virtual leaf cells and virtual leaf cell interfaces coupling pairs of said instances, or b) virtual hierarchical cells and a virtual hierarchical cell interface coupling said instances;

means for creating and storing an instance of a virtual hierarchical cell in the layout database;

means for coupling instances of virtual hierarchical cells, and storing the coupling in the memory unit; and a processor operatively coupled to the library, the database, the memory unit, for selectively retrieving therefrom and storing selectively therein virtual cells, and virtual interfaces.

* * * * *

UNITED STATES PATENT AND TRADEMARK OFFICE
CERTIFICATE OF CORRECTION

PATENT NO. : 5,604,680
DATED : February 18, 1997
INVENTOR(S) : Cyrus Bamji and Ravi Varadarajan It is certified that error appears in the above-indentified patent and that said Letters Patent is hereby corrected as shown below:

In claim 2, line 11, column 13, delete "receiving a first user input".

Signed and Sealed this

Third Day of June, 1997

*Attest:*

BRUCE LEHMAN

*Attesting Officer*   Commissioner of Patents and Trademarks